United States Patent [19]

Kuznetzoff

[11] 4,270,823
[45] Jun. 2, 1981

[54] METHOD OF FORMING CONDUCTORS IN SLOTS IN A PLATE

[75] Inventor: Philip Kuznetzoff, Bridgewater, N.J.

[73] Assignee: Burroughs Corporation, Detroit, Mich.

[21] Appl. No.: 81,000

[22] Filed: Oct. 1, 1979

Related U.S. Application Data

[63] Continuation-in-part of Ser. No. 938,927, Sep. 1, 1978, abandoned.

[51] Int. Cl.³ ............................ H01J 9/18; H01J 17/16
[52] U.S. Cl. ..................................... 316/19; 29/25.16; 313/220; 427/275; 427/357; 427/376.3; 427/376.6; 427/123
[58] Field of Search ................. 427/123, 117, 105, 96, 427/275, 376.3, 376.6, 356, 357; 106/1.13; 313/188, 220; 29/25.16; 316/19

[56] References Cited

U.S. PATENT DOCUMENTS

| | | |
|---|---|---|
| 2,297,488 | 9/1942 | Luderitz .............................. 427/105 |
| 2,599,710 | 6/1952 | Hathaway .............................. 427/96 |
| 2,785,997 | 3/1957 | Marvin .............................. 427/275 |
| 3,347,703 | 10/1967 | Engelman et al. .................... 427/96 |
| 3,392,052 | 7/1968 | Davis .................................. 427/96 |
| 3,942,061 | 3/1976 | van Esdonk et al. ............... 313/188 |
| 4,010,395 | 3/1977 | Holz .................................. 313/188 |
| 4,032,350 | 6/1977 | Greenstein ........................ 106/1.13 |

Primary Examiner—Ronald H. Smith
Assistant Examiner—Richard Bueker
Attorney, Agent, or Firm—Kevin R. Peterson; Robert A. Green; David G. Rasmussen

[57] ABSTRACT

Conductors are formed in slots in a plate by filling the slots with a carrier medium having high viscosity in which metallic particles are dispersed and then, by lowering the viscosity of the medium, permitting the particles to settle to the bottom of the slots. The carrier medium is then removed, and the metal particles are bonded to the bottom of the slots. A rake-like device is also used to shape all of the electrodes so that they are uniformly spaced from the top surface of the plate.

1 Claim, 9 Drawing Figures

Fig. 5
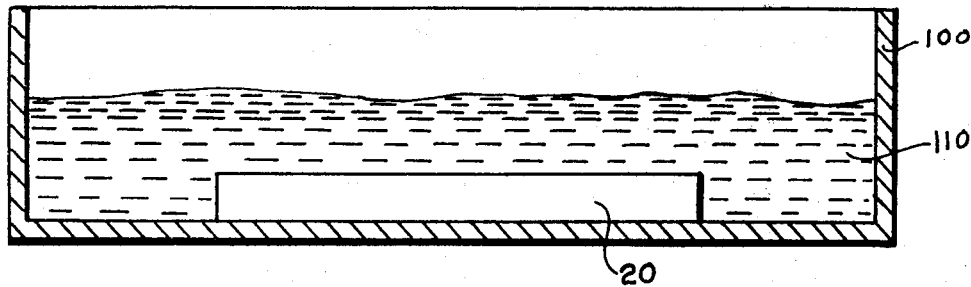
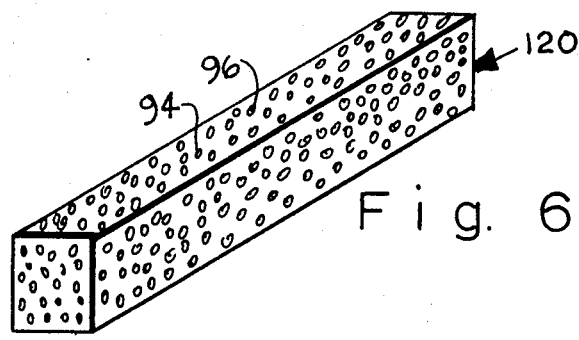
Fig. 6
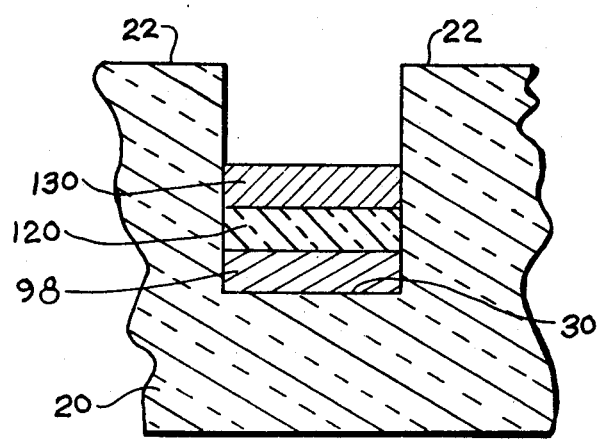
Fig. 7

Fig. 8
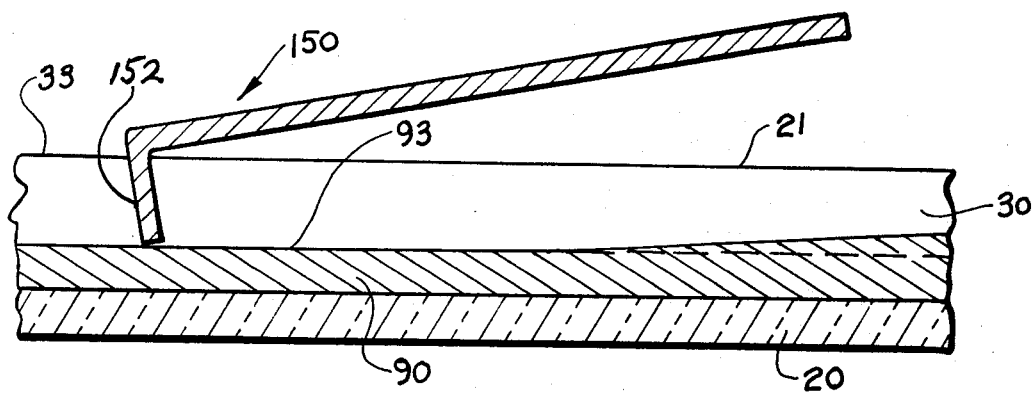
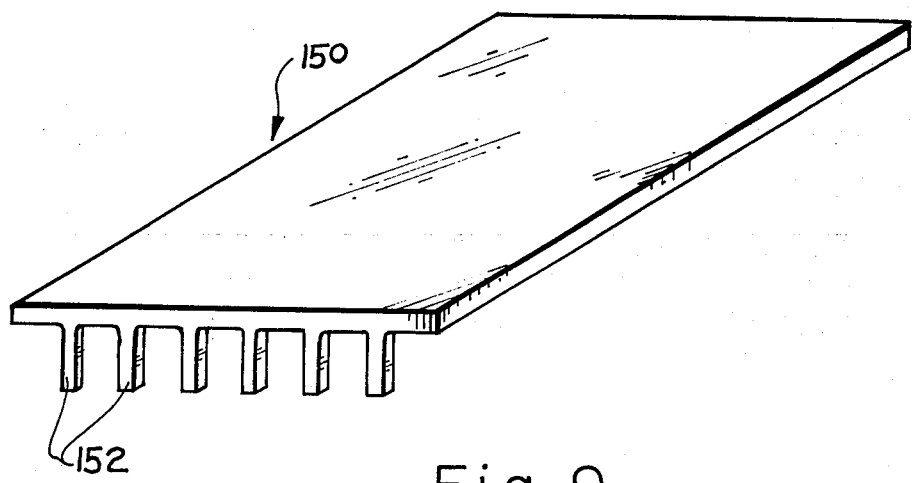
Fig. 9

METHOD OF FORMING CONDUCTORS IN SLOTS IN A PLATE

CROSS-REFERENCE TO RELATED APPLICATION

This application is a continuation-in-part of application Ser. No. 938,927, filed Sept. 1, 1978, now abandoned.

BACKGROUND OF THE INVENTION

In the fabrication of display devices such as SELF-SCAN panels, conductors are placed in grooves which have been formed in a glass or ceramic substrate. In one type of SELF-SCAN panel, the conductors are wires which are first wound on a "harp," then located in the grooves, and fastened in place with a frit. This method is generally satisfactory although it is rather time consuming and there is a frequent problem with loose wires. Other types of panels require a relatively thin conductor (approx. 1 mil) at the bottom of a deep groove, with no conductive material present on the side walls of the grooves, and there are no suitable known methods of providing such conductors.

DESCRIPTION OF THE DRAWINGS

FIG. 5 is a side elevational view of apparatus illustrating a modification of the invention;

FIG. 6 is a perspective view of a modification of apparatus used in practicing the invention;

FIG. 7 is a sectional view of a portion of a display panel embodying a modification of the invention;

FIG. 8 is a sectional view of a portion of a display panel and auxiliary apparatus illustrating a modification of the invention; and FIG. 9 is a perspective view of the auxiliary apparatus shown in FIG. 8.

DESCRIPTION OF THE PREFERRED EMBODIMENTS

Figure 1:
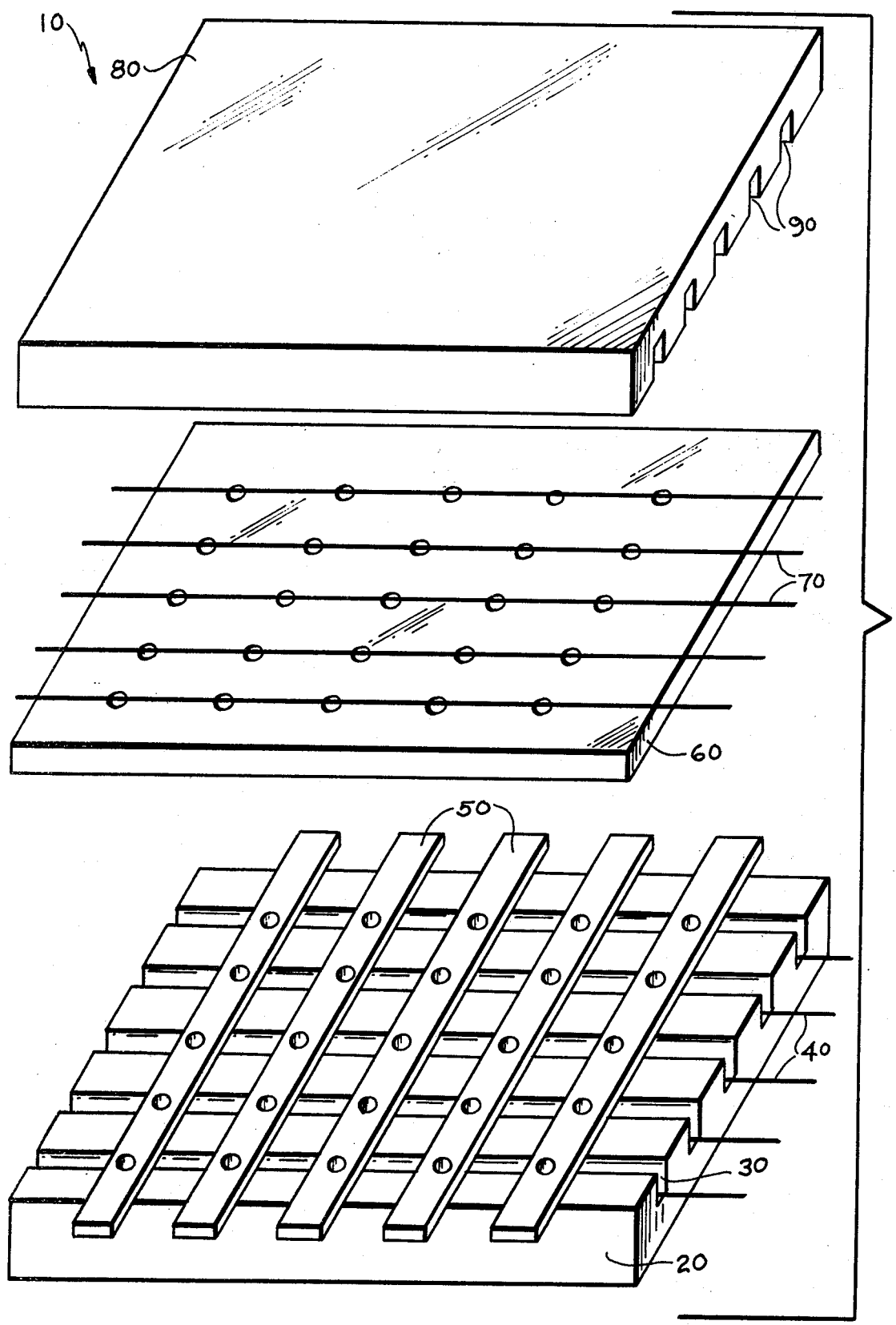
FIG. 1 is a perspective exploded view of a display panel embodying the invention.

The principles of the invention are described with respect to a SELF-SCAN panel of the type shown in U.S. Pat. No. 4,010,395. Briefly, a SELF-SCAN panel 10 includes a base plate 20 having slots or grooves 30 in which scan anode electrodes 40 are seated and apertured cathode strips 50 which are seated on the top surface of the base plate and oriented transverse to the scan anodes 40. An insulating cell sheet 60 having apertures or cells 64 is provided on the cathodes, and display anode wires 70 are disposed between the cell sheet 60 and panel face plate 80 and oriented parallel to the scan anodes. It is noted that the display anodes may be seated in slots 90 in the face plate. In a completed panel, all parts are hermetically sealed together, and the panel is filled with an ionizable gas or gas mixture.

The present invention relates to a method of providing electrodes in slots such as in the base plate and/or face plate of a SELF-SCAN panel to form the scan anodes and display anodes thereby.

Figure 2:
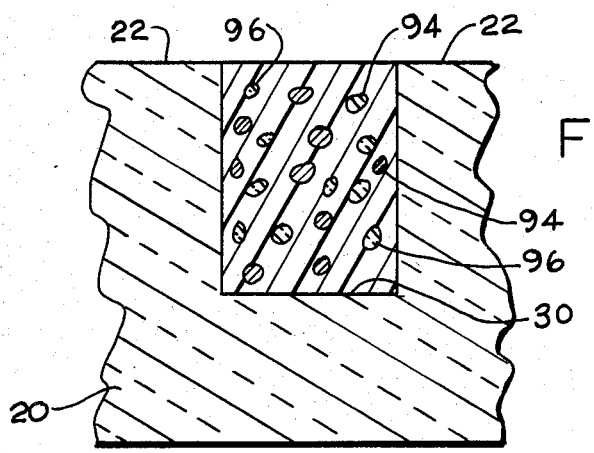
FIGS. 2, 3, and 4 are sectional views of a portion of the panel of FIG. 1 at various stages in the preparation thereof.
Figure 3:
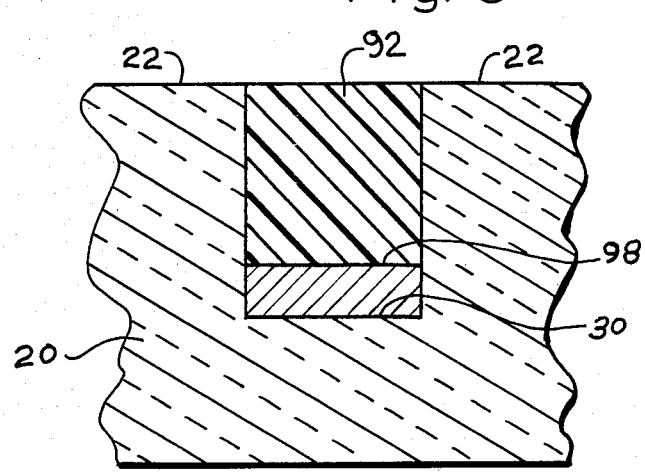
Figure 4:
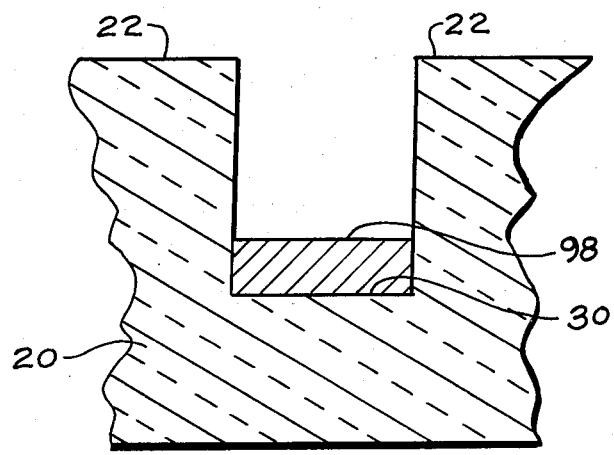

A method of forming electrodes in slot 30 in the base plate 20, for example, comprises filling the slots with a high viscosity carrier medium 92, such as a paste, in which are dispersed particles of a conductive material 94 and a glass frit 96. This is shown exaggerated in size in FIG. 2. This operation can be performed by a rubbing or squeegee application, which leaves the top lands 22 of plate 20 clean. The paste carrier medium is chosen to have the desired viscosity at working temperature, e.g. room temperature, a moderate melting point such as 60°-200° C., and low viscosity upon melting. When the filled grooves 30 are heated and the medium melts, the suspended conductive and glass frit particles settle rapidly to the bottom of the grooves as a layer 98, as seen in FIG. 3. Subsequent firing drives off the medium 92 and fuses the conductive particles and glass frit to the bottom of the groove to form layer 98 into a conductive electrode layer thereon, but not on the side walls, as seen in FIG. 4.

In one embodiment of the invention, the carrier medium comprised paraffin wax and petrolatum, and the conductive particles were of silver.

In a modification of the invention (FIG. 5), the grooved base plate 20 is placed in a container 100 at the bottom of a layer 110 of a settling medium such as water, alcohols, etc., which have a low viscosity. The conductive and frit particles are dispersed in the medium 110 and allowed to settle, coating both the bottoms of grooves 30 and the top land surfaces 22. The base plate is removed, dried and fired to provide the desired electrodes, and the surplus material on the top lands 22 is ground off.

Materials other than those specifically mentioned above can be used in practicing the invention, as will be clear to those skilled in the art. For example, a metal such as nickel has been used successfully for the conductive material.

In addition, the carrier medium including metal 94 and glass frit 96 particles may be provided as a preform 120, shown in FIG. 6, which can be handled manually and inserted in each of the slots in a base plate 20. The assembly of base plate and preforms is processed as above to form the electrode layers.

The principles of the invention may also be used to form multiple conductive layers in slots in a base plate by forming the first conductive film 98 (FIG. 7) in the manner described above, then providing an insulating layer 120 of glass or the like, and then forming a second conductive layer 130 by the method described above.

In a modification of the invention illustrated in FIGS. 8 and 9, electrodes 90 (one is shown) are formed at the bases of slots 30 in base plate 20. Either because the slots 30 vary in depth or because the electrodes 90 vary in thickness or for some other reason, the top surfaces of the electrodes are not all uniformly spaced from the top surface 21 of base plate 20 and thus from electrodes 50 in the completed panel. For proper operation of a display panel of the type described above, the electrodes 90 must be uniformly spaced from the top surface 21 and from electrodes 50.

According to the invention, a tool 150 which is, in effect, a rake, having fingers 152 of identical length and having width substantially equal to the width of slots 30, is placed on the top surface 21 of plate 20 so that fingers 152 all extend into slots 30 the same distance. The rake is drawn along the length of the plate with the fingers 152 in slots 30 whereby the fingers remove portions of the electrodes (shown in dash lines) to leave electrodes 90 which all have their top surfaces 93 spaced by an exact and selected amount from the top surface of the glass plate.

What is claimed is:

1. A method of making a display panel comprising:

providing a glass support plate having a top surface and having a plurality of parallel slots formed in said top surface and varying in depth beneath said top surface, completely filling all of said slots with the same filling material comprising a carrier medium including metal and glass frit particles, permitting said metal and glass frit particles to settle through said medium to the bottom of each of said slots, removing said medium to leave a film of metal and glass frit particles as an electrode at the base of each of said slots, fusing said glass frit to fix said electrodes in place in said slots, using the top surface of said plate as a guide, removing surface portions of said electrode so that the top surfaces of all of said electrodes become uniformly spaced below the top surface of the support plate, said electrodes comprising first anode electrodes, mounting a plurality of cathode electrodes on the top surface of said support plate transverse to said first anode electrodes, so that each cathode crosses each first anode and defines a first gas cell, there being rows and columns of such first gas cells, seating a cell sheet having top and bottom surfaces on said cathodes, said cell sheet having rows and columns of apertures, each aperture being aligned with a first gas cell, providing a set of second anode electrodes on the top surface of said cell sheet, said second anode electrodes being disposed transverse to said cathode electrodes and defining rows and columns of second gas cells therewith, hermetically sealing a viewing face plate to said support plate to form an envelope enclosing said first and second anode electrodes, said cathode electrodes and said cell sheet, and filling said envelope with an ionizable gas.

* * * * *